United States Patent [19]

Rankin

[11] 4,172,237

[45] Oct. 23, 1979

[54] LOW DISTORTION AMPLIFIER

[76] Inventor: John C. Rankin, 908 S. Blvd., Los Angeles, Calif. 90006

[21] Appl. No.: 972,952

[22] Filed: Dec. 26, 1978

[51] Int. Cl.² .............................................. H03F 3/38
[52] U.S. Cl. ....................................... 330/10; 330/149
[58] Field of Search ................................... 330/10, 149

[56] References Cited

U.S. PATENT DOCUMENTS 3,859,604  1/1975  Rankin ................................... 330/10

Primary Examiner—James B. Mullins

[57] ABSTRACT

A transistor amplifier consisting of a modulated radio frequency generator and a detector circuit wherein the operating portion of the input-output curve of the radio frequency generator is a complement of the operating portion of the input-output curve of the detector circuit. The curvature of the radio frequency generator is controlled by variation in the current of a radio frequency voltage through a diode, changing the loading on a tuned circuit so that the amplifier may be adjusted for low, zero or negative harmonic distortion. The amplifier may be adjusted to compensate for distortion in equipment connected to its input terminals or distortion in equipment connected to its output terminals.

3 Claims, 4 Drawing Figures

LOW DISTORTION AMPLIFIER

BACKGROUND OF THE INVENTION

This invention relates generally to a method of eliminating distortion from amplifiers using a modulated radio frequency carrier and a detector circuit. Such amplifiers can be used advantageously in systems requiring isolation where a radio frequency isolation transformer has many advantages over an audio frequency transformer. Due to the nonlinearity in most modulation and detection systems they have been avoided where low distortion is required. Where previous methods for lowering distortion have been directed at decreasing the curvature of the input-output curves of radio frequency generators and detection systems, this invention removes the distortion by making the curves complementary.

It is accordingly an object of the present invention to provide a modulated generator and detector system with distortion of zero percent.

Another object of the invention is to nullify the distortion from equipment such as an audio frequency oscillator connected to the input terminals of this invention.

A further object of the invention is to nullify the distortion from equipment such as an emitter follower connected to the output terminals of this invention.

SUMMARY OF THE INVENTION

In the present invention a transistor is used to generate radio frequency oscillations with means for applying modulation to the base circuit. The radio frequency current flow in the base-emitter circuit is controlled in a manner to make the input-output curve of the generator a complement of the input-output curve of the detector used to detect the modulated signal. By adjusting the base-emitter current flow, the distortion of the system may be varied through zero to a form of negative distortion.

DESCRIPTION OF THE PREFERRED EMBODIMENTS

Figure 1:
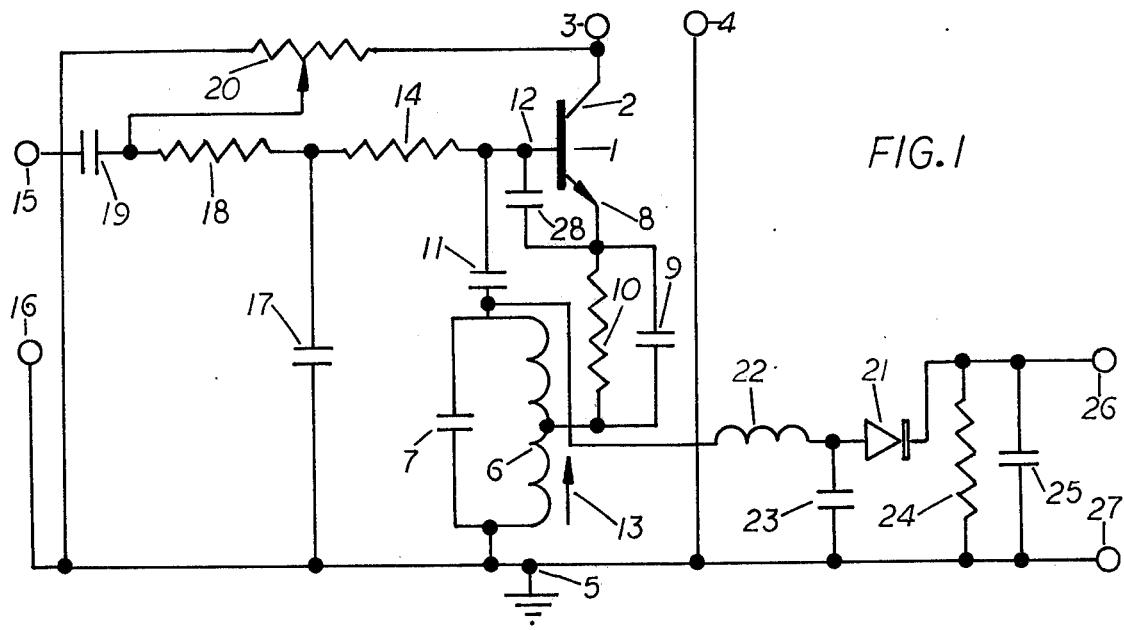
FIG. 1 is a schematic illustrating the fundamentals of the invention, for alternating current amplification.
Figure 2:
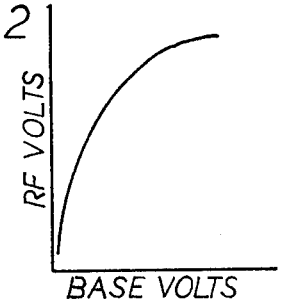
FIG. 2 shows a curve of the transistor base volts versus the generator radio frequency volts out.
Figure 3:
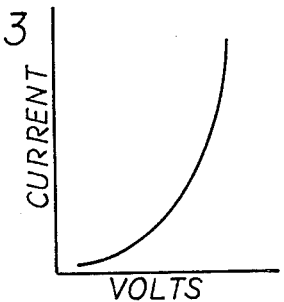
FIG. 3 shows a curve of the detector circuit volts versus current out.

Referring now in detail to FIG. 1 which is a schematic showing transistor 1 connected as a generator of radio frequency oscillations, the collector 2 is shown connected to positive 3 of the power supply and negative 4 of the power supply is shown connected to common ground point 5. Coil 6 and capacitor 7 form a resonant circuit with feedback supplied by current flowing between collector 2 and emitter 8 via capacitor 9 and resistor 10, through coil 6 to ground 5. The radio frequency voltage across the resonant circuit of coil 6 and capacitor 7 is applied through capacitor 11 to the base 12 and oscillation results. The variable core 13 of coil 6 varies the frequency of oscillation. Resistor 14 performs three separate functions, firstly it prevents the modulating signal equipment, when connected to the input terminals 15 and 16, from short circuiting the radio frequency voltage on base 12, to ground 5. Secondly, resistor 14 which is connected in series with capacitors 11 and 17, is across coil 6 as a load resistor to limit the amplitude of the radio frequency oscillations to a near linear portion of transistor 1 transfer curve. Capacitors 11 and 17 have a low reactance at radio frequencies and a high reactance at audio frequencies applied to terminals 15 and 16. If the frequency of oscillations is in the vicinity of 10 Mega Hertz then a suitable value for capacitor 17 is 150 picofarads which will have a reactance of 100 ohms at 10 Mega Hertz. Assuming that resistor 18 is one ohm or less and capacitor 19, which is a direct current blocking capacitor, will pass audio frequencies, connecting equipment with an impedance of 10,000 ohms or greater to terminals 15 and 16 will have very little effect on the loading of coil 6. The third function of resistor 14 is to provide a partial constant current source for audio frequencies flowing from terminal 15 through base 12 to emitter 8 so that the voltage applied to terminal 15 is subjected to non linear compression at base 12. It is not always possible to have resistor 14 with a value which will be satisfactory for both loading and compression so the value of resistor 14 is chosen primarily for correct loading and resistor 18 is set in value for additional compression. Resistor 18 has a second function, if it is in excess of 1000 ohms it is then possible to connect equipment with zero impedance to the input terminals 15 and 16 with very little change in the loading of coil 6. The variable resistor 20 sets the forward bias for base 12 of transistor 1. The modulated radio frequency voltage appearing across coil 6 is connected to the detector 21 through a low pass filter consisting of choke coil 22 and capacitor 23. The low pass filter reduces the amplitude of the radio frequency harmonics generated by transistor 1, at the detector 21. The resistor 24 is the detector load resistor and capacitor 25 is the detector load bypass capacitor. The audio output terminals are shown as 26 and 27. A capacitor 28 is shown connected between base 12 and emitter 8 of transistor 1 and it is also connected through capacitors 9 and 11 across portion of coil 6, to form a resonant circuit at a harmonic of the radio frequency generator. At higher harmonic frequencies, capacitor 7 has a low reactance and tends to act as a short circuit across coil 6 but because of incomplete coupling between the windings of coil 6, there is a small amount of residual inductive reactance in coil 6 at harmonic frequencies. If the variable core 13 is varied, a position will be found where capacitor 28 and the portion of coil 6 connected to capacitors 9 and 11, resonate at a radio frequency harmonic and cause a controllable harmonic current to flow between base 12 and emitter 8. This harmonic resonance may also be obtained by making capacitor 7, 9 or 28 variable. The controllable harmonic current results in controllable loading of coil 6 and since the current path through base 12 and emitter 8 is a nonlinear diode the effect is nonlinear loading of coil 6. Assuming no input at terminals 15 and 16, if the variable resistor 20 is varied to increase the current flow through base 12, the amplitude of the fundamental radio frequency and the radio frequency harmonics will rise at coil 6. The radio frequency harmonics appear at the detector 21 at only very small amplitudes because of the low pass filter action of choke coil 22 and capacitor 23 but the increased harmonic amplitude flowing in the base 12 emitter 8 circuit causes loading on coil 6 which causes compression of the radio frequency fundamental and compression of the direct current voltage appearing across resistor 24. It will be noted that this is an inverse action controlled by transistor diode current and follows the law of semiconductors. By controlling the radio frequency harmonic current through the base 12 emitter 8 junction the operating portion of the fundamental radio frequency voltage curve across coil 6 can be made a compliment of the operating portion of the curve of the detector 21 and its circuitry so that the resultant curve is a straight line of zero distortion. FIG. 2 shows a curve of base 12 volts on the X axis and the resultant radio frequency voltages on the Y axis. FIG. 3 shows the curve of the detector 21 with volts in on the X axis and current out on the Y axis. It is desired to point out that it is the operating portions of the curves which are made complimentary, not the whole curve. It has been found that it is desireable to use a silicon transistor for transistor 1 and a germanium diode for detector 21, the voltage-current curves for these two semiconductors are not similar, but portions of the curves can be made similar when used with equipment described herein.

If an audio frequency signal is applied to terminals 15 and 16 of the amplifier shown in FIG. 1 and the variable core 13 adjusted for excessive base 12 emitter 8 harmonic curent with some distortion at the output terminals 26 and 27, the distortion may be reduced by trapping some of the radio frequency harmonic current with a resonant circuit coupled to coil 6. The coupled resonant circuit need not be resonant at the same frequency as the harmonic tuned by capacitor 28 and portion of coil 6, the coupled circuit may be resonant at another harmonic because the higher harmonics may be considered as using the lower harmonics as a base line and changing any one will change the peak sum and consequently the distortion. If the variable core 13 of the set up just described is moved in the opposite direction so that the base 12 emitter 8 radio frequency harmonic current is decreased, with some distortion at the output terminals 25 and 26, the distortion may be reduced by injecting a radio frequency voltage into coil 6. The injected voltage may be of almost any frequency except at the fundamental or harmonics where beat frequencies will occur and also the injected voltage must be coupled to supply exactly the required current in the base 12 emitter 8 circuit.

In the last two examples, moving the variable core 13 changed the fundamental frequency and consequently the harmonic was moved on the slope of the curve produced by capacitor 28 and residual reactance of coil 6 at the harmonic frequency. In both of these examples it is possible to couple a circuit, tuned near to resonance at the fundamental, to coil 6, so that reactance, inductive or capacitive, is reflected across coil 6 to tune coil 6 to the original fundamental frequency and reduce the distortion to the previous low value.

To further illustrate the nature of the invention, if an alternating current voltmeter is connected to the output terminals 26 and 27 of FIG. 1 with an audio frequency signal applied at input terminals 15 and 16 and the variable core 13 varied over a wide range, the voltmeter reading will remain relatively constant. But if a harmonic distortion meter is also connected to output terminals 26 and 27 it will show many dips and peaks as the variable core 13 is moved. This occurs because the change in reactance of coil 6 with changes of variable core 13 causes phase changes to each harmonic, of the radio frequency fundamental, to a different degree, causing a variation in the total peak sum of the harmonic amplitudes. This variation causes a change in loading current through base 12 and emitter 8 which changes the distortion. In a suitably designed circuit there are four major dips in harmonic distortion readings, one on each side of the harmonic resonance curve of capacitor 28 and residual reactance of coil 6 when the variable core 13 is at one end of the coil 6 and one at each side of the harmonic resonance curve with the variable core 13 at the other end of coil 6.

Referring again to capacitor 28 of FIG. 1, if transistor 1 has a gain bandwidth product in the vicinity of 250 Mega Hertz the capacitor 28 may be as small as 2 or 3 picofarads because the controlled harmonic can be very high in frequency. In this case the choke coil 22 may take the form of a connecting lead and diode capacity of detector 21 plus stray capacity taking the place of capacitor 23.

It is also possible to use a five watt type transistor for transistor 1 which may have a gain bandwidth product in the vicinity of 100 Mega Hertz and an input capacity of 50 picofarads and in this case an external capacitor 28 is not required. However, pursuant with the theory and practical aspects of the invention, in the last two examples it is essential that the detector load resistor 24 be chosen so that the detector 21 is operating on a curve which is a complement of a curve which can be produced by base 12 and emitter 8 compression.

Most harmonic distortion in audio frequency equipment is caused by nonlinear curvature similar to the curve shown in FIG. 3. If an audio frequency oscillator with this type of distortion amounting to 0.05 percent as an example, is connected to terminals 15 and 16 of the amplifier shown in FIG. 1, the variable core 13 may be adjusted for additional radio frequency harmonic current between base 12 and emitter 8 so that the compression is increased to compensate and reduce the distortion at terminals 26 and 27 to zero.

If the terminals 26 and 27 of FIG. 1 in the set up just described, are connected to an emitter follower which has distortion, the variable core 13 may be again adjusted so that the combined overall distortion of the audio frequency oscillator and emitter follower is reduced to zero.

Figure 4:
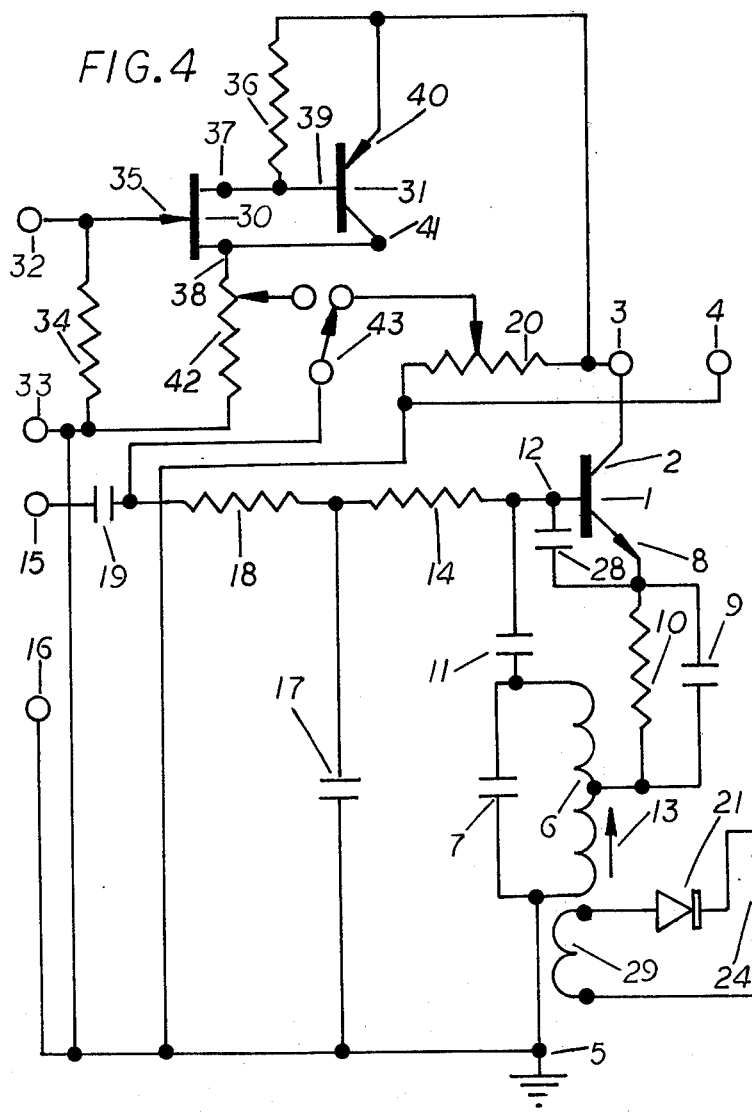
FIG. 4 is a schematic showing a version of the invention which has the output isolated from the input and it may be used to amplify alternating or direct current voltages.

FIG. 4 shows a second version of the invention which differs in two major respects from the amplifier of FIG. 1. Firstly, a coil 29 has been added in FIG. 4 to form a transformer of coils 6 and 29, also transistor 30 and transistor 31 have been incorporated to provide a means of amplifying direct current voltages applied to terminals 32 and 33. The addition of coil 29 provides a number of benefits, firstly the transformer action can have a step up ratio and more voltage will be available at the output terminals 26 and 27. Secondly, the choke coil 22 and capacitor 23 of FIG. 1 are not required physically if the coupling coefficient of coils 6 and 29 is small at harmonic frequencies, the low pass filter being formed by leakage reactance and detector 21 diode capacity. Thirdly, the input terminals 15,16 32 and 33 are isolated from the output terminals 26 and 27. There can be leakage reactance at the fundamental which also appears as an inductance in series with the secondary coil 29 and the detector 21. This leakage reactance thus acts as a partial constant current source and causes some compression of the voltage appearing across the detector load resistor 24. The field effect transistor 30 is connected to the bipolar transistor 31 to form an enhanced source follower. Resistor 34 connects the gate 35 to ground connection 5, current flowing through resistor 36 via drain 37 and source 38 causes current to flow between base 39 and emitter 40 of transistor 31, this causes current to flow through collector 41 to emitter 40 via variable resistor 42 and augments the drain 37 to source current also flowing through variable resistor 42. The pole of switch 43 is shown connected to variable resistor 20 for low noise alternating current operation using input terminals 15 and 16. When the pole of switch 43 is switched to the variable resistor 42 the direct current voltage applied to input terminals 32 and 33 appears as a change in voltage across variable resistor 42 and is applied to the junction of resistor 18 and capacitor 19. This changes the forward bias of base 12 and appears as a change in direct current voltage across the output terminals 26 and 27.

Assuming switch 43 pole is switched to variable resistor 42 with an audio frequency signal applied to input terminals 32 and 33 and variable resistor 42 together with variable core 13 adjusted for zero amplifier distortion at the output terminals 26 and 27. The amplifier will then have one hundred percent linearity for a direct current voltage of the same magnitude as the audio frequency signal and by adjusting the variable core 13 nonlinearity before or after the amplifier may be compensated for.

The foregoing description has dwelt on the benefits of using a radio frequency harmonic to control current for nonlinear loading and if consideration is given to the possibility of using the fundamental radio frequency for control current it will be realized that an increase in current of the fundamental between base 12 and emitter 8 of FIG. 4 will cause an increase in loading of coil 6 but simultaneously there will be some increase in output to the detector 21 which would tend to defeat the purpose of the invention. It will be apparent that this is, in effect, insufficient compression and it has been shown experimentally that the fundamental can be used with the following changes to FIG. 4. Capacitor 28 is removed, resistor 18 is increased in value to provide increased compression, coupling between coils 6 and 29 is decreased to increase the leakage reactance and the value of the detector load resistor 24 is decreased. Control of the fundamental is accomplished by changing the supply voltage at terminals 3 and 4, the variable core 13 is not moved and at one critical voltage the distortion will be reduced as the two curves become complementary but the efficiency of this system is low compared to harmonic control. It will be realized that the system just described is not entirely fundamental control as a small percentage of harmonics will also be present in the base 12 and emitter 8 circuit of FIG. 4 even if there is no circuitry tuned to a harmonic frequency. However, the amount of harmonics present may be disregarded when compared to a system where a harmonic is selected by a tuned circuit, the resonance causes regeneration and amplification at the harmonic frequency and the harmonic amplitude can be very high. If in the previously described example of a transistor with a gain bandwidth product of 250 Mega Hertz using a value of 2 or 3 picofarads for capacitor 28, this value were to be increased to 50 picofarads to resonate a low frequency harmonic, the gain at the low frequency harmonic would be great enough to cause oscillation at the harmonic frequency so this situation is avoided by using a high frequency for harmonic control.

The following figures are included by way of example only and should not be construed in any way as limiting this invention. Using transistors type 2N2102 or 2N4123 for transistor 1 of FIG. 4 with 0.25 RMS volts applied at input terminals 15 and 16 the amplifier delivers 0.6 RMS volts at output terminals 26 and 27 with zero harmonic distortion using a 5.6 volt power supply with a collector current of 600 microamperes.

What has been described hereinbefore is a specific illustrative embodiment of the present invention. It is apparent that numerous modifications of circuitry and component parts may be utilised without departing from the spirit of the invention. For example the radio frequency generator may incorporate amplification before detection by using a second transistor as a radio frequency amplifier while using the present invention. Also many other changes such as replacing bipolar transistors with field effect transistors and using a separate diode for coil loading are obviously possible. Accordingly the above description is illustrative of the principles of the present invention and numerous modifications thereof may be devised by those skilled in the art without departing from the spirit and scope of the invention.

What is claimed is:

1. A low distortion amplifier comprising:
   a transistor having a base, emitter and collector operating as a radio frequency generator, a power supply with resistance means connected between said power supply, said base and said emitter for establishing a stable direct current operating point for said transistor;
   means for modulating said radio frequency generator with the signal to be amplified by applying said signal to be amplified to two input terminals so that said signal to be amplified is also applied between said base and said emitter through a common ground point;
   a frequency determining resonant circuit of said radio frequency generator composed of a coil and a first capacitor connected in parallel, said resonant circuit connected between said base and said common ground point, said resonant circuit coupled between said base and said emitter and generating a radio frequency voltage between said base and said emitter;
   a detector circuit with a first diode and a first resistor, the first lead of said first diode connected to the first lead of said first resistor with a second capacitor connected in parallel with said first resistor, the second lead of said first diode and the second lead of said first resistor forming the detector circuit input with said detector circuit input coupled to said resonant circuit so that the demodulated output appears across said first resistor;
   a second and a third resistor with one end of said second resistor connected to one end of said third resistor to form a junction, the second end of said second resistor connected to said base, the second end of said third resistor connected through a third capacitor to one of said input terminals so that said second resistor and said third resistor act as a partial constant current source to apply compression to said signal to be amplified at said base;
   a fourth capacitor connected from said junction of said second resistor and said third resistor to said common ground point so that said second resistor acts as a loading resistor across said resonant circuit to limit the amplitude of the radio frequency voltage across said resonant circuit;

a second diode in the form of said base and said emitter junction effectively connected across said resonant circuit with the fundamental radio frequency voltage applied between said base and said emitter adjusted in amplitude so that said second diode current flow loads said resonant circuit causing compression of the said radio frequency voltage across said resonant circuit so that the curve of audio frequency voltage across said input terminals versus change in radio frequency voltage across said detector circuit input and the curve of said change in radio frequency voltage across said detector circuit input versus audio frequency voltage across said first resistor are complementary in shape.

2. A transistor having a base, emitter and collector operating as a radio frequency generator, a power supply with resistance means connected between said power supply, said base and said emitter for establishing a stable direct current operating point for said transistor;

means for modulating said radio frequency generator with the signal to be amplified by applying said signal to be amplified to two input terminals so that said signal to be amplified is also applied between said base and said emitter through a common ground point;

a frequency determining resonant circuit of said radio frequency generator composed of a coil and a first capacitor connected in parallel, said resonant circuit connected between said base and said common ground point, said resonant circuit coupled between said base and said emitter and generating a radio frequency voltage between said base and said emitter;

a detector circuit with a first diode and a first resistor, the first lead of said first diode connected to the first lead of said first resistor with a second capacitor connected in parallel with said first resistor, the second lead of said first diode and the second lead of said first resistor forming the detector circuit input with said detector circuit input coupled to said resonant circuit so that the demodulated output appears across said first resistor;

a second and a third resistor with one end of said second resistor connected to one end of said third resistor to form a junction, the second end of said second resistor connected to said base, the second end of said third resistor connected through a third capacitor to one of said input terminals so that said second resistor and said third resistor act as a partial constant current source to apply compression to said signal to be amplified at said base;

a fourth capacitor connected from said junction of said second resistor and said third resistor to said common ground point so that said second resistor acts as a loading resistor across said resonant circuit to limit the amplitude of the radio frequency voltage across said resonant circuit;

a second diode in the form of said base and said emitter junction effectively connected across said resonant circuit, an inductance with a fifth capacitor connected in parallel to form a tuned circuit with resonance in the vicinity of a harmonic of said radio frequency generator, said tuned circuit connected between said base and said emitter and coupled to said resonant circuit with voltage of said harmonic appearing across said tuned circuit, said voltage of said harmonic adjusted in amplitude so that said second diode current flow loads said resonant circuit causing compression of the said radio frequency voltage across said resonant circuit so that the curve of audio frequency voltage across said input terminals versus change in radio frequency voltage across said detector circuit input and the curve of said change in radio frequency voltage across said detector circuit input versus audio frequency voltage across said first resistor are complimentary in shape;

a radio frequency low pass filter to impede harmonics of said radio frequency generator inserted between said resonant circuit and said detector circuit input.

3. A transistor having a base, emitter and a collector operating as a radio frequency generator, a power supply with resistance means connected between said power supply, said base and said emitter for establishing a stable direct current operating point for said transistor;

means for modulating said radio frequency generator with the signal to be amplified by applying said signal to be amplified to two input terminals so that said signal to be amplified is also applied between said base and said emitter;

a detector circuit using a diode and a resistor, the first lead of said diode connected to the first lead of said resistor with a capacitor connected in parallel with said resistor, the second lead of said diode and the second lead of said resistor forming the detector circuit input, with the said detector circuit input coupled to said radio frequency generator so that the demodulated output appears across said resistor, the resistance value of said resistor being such to cause the curve of audio frequency voltage across said resistor versus change in radio frequency voltage across said detector circuit input and the curve of audio frequency voltage across said input terminals versus said change in radio frequency voltage across said detector circuit input to be complementary in shape.

* * * * *

UNITED STATES PATENT AND TRADEMARK OFFICE
CERTIFICATE OF CORRECTION

PATENT NO. : 4,172,237
DATED : October 23, 1979
INVENTOR(S) : John C. Rankin

It is certified that error appears in the above—identified patent and that said Letters Patent is hereby corrected as shown below:

On the title page the Inventor's domicile, "908 S. Blvd." should read --908 S. Hobart Blvd.--.

Column 3, line 11, "compliment" should read --complement--.
          line 19, "complimentary" should read --complementary--

Signed and Sealed this

Nineteenth Day of February 1980

[SEAL]

Attest:

SIDNEY A. DIAMOND

Attesting Officer     Commissioner of Patents and Trademarks